(12) United States Patent
Logan et al.

(10) Patent No.: US 8,748,231 B2
(45) Date of Patent: Jun. 10, 2014

(54) COMPONENT ASSEMBLY USING A TEMPORARY ATTACH MATERIAL

(75) Inventors: Elizabeth Anne Logan, Danville, CA (US); Terry Lee Marvin Cookson, Hayward, CA (US); Sisira Kankanam Gamage, Palo Alto, CA (US); Ronald Almy Hollis, Pleasant Grove, UT (US)

(73) Assignee: Amphenol Thermometrics, Inc., St. Marys, PA (US)

( * ) Notice: Subject to any disclaimer, the term of this patent is extended or adjusted under 35 U.S.C. 154(b) by 311 days.

(21) Appl. No.: 13/215,393

(22) Filed: Aug. 23, 2011

(65) Prior Publication Data
US 2013/0049232 A1 Feb. 28, 2013

(51) Int. Cl.
*H01L 21/00* (2006.01)
*H01L 21/44* (2006.01)

(52) U.S. Cl.
USPC .............................. 438/118; 438/464; 438/617

(58) Field of Classification Search
USPC .......................................... 711/118, 464, 617
See application file for complete search history.

(56) References Cited

U.S. PATENT DOCUMENTS

| | | | |
|---|---|---|---|
| 8,334,158 B2 | 12/2012 | Takahata et al. | |
| 2007/0290376 A1* | 12/2007 | Zhao et al. | 257/787 |
| 2008/0318054 A1* | 12/2008 | Fillion et al. | 428/412 |
| 2010/0244234 A1* | 9/2010 | Sonobe et al. | 257/693 |
| 2010/0252923 A1* | 10/2010 | Watanabe et al. | 257/737 |
| 2011/0229375 A1* | 9/2011 | Ehrenpfordt et al. | 422/68.1 |
| 2013/0193530 A1* | 8/2013 | Ehrenpfordt | 257/415 |

FOREIGN PATENT DOCUMENTS

DE     102010001711     * 8/2011

OTHER PUBLICATIONS

Search Report and Written Opinion from PCT/US2013/027594 dated Sep. 13, 2013.
S. Corbett and P. Ongley, Innovations in Thermoplastic Die Attach Adhesives for Microelectronic Packaging, The First IEEE International Symposium on Polymeric Packaging, Oct. 1997, pp. 178-189, Norrköping, Sweden.
Dr. Ken Gilleo et al., Thermoplastic Adhesives—The Attachment Solution for Multichip Modules, EPS Conference, Sep. 1993, Jersey City, New Jersey.

* cited by examiner

*Primary Examiner* — James Mitchell
(74) *Attorney, Agent, or Firm* — Blank Rome LLP

(57) ABSTRACT

A method of attaching a die to a carrier using a temporary attach material is disclosed. The method comprises attaching the temporary attach material between a surface of the die and a surface of the carrier. The temporary attach material attaches the die to the carrier. The method comprises bonding at least one connector to the die and the carrier. The connector includes a first end bonded to the carrier and a second end bonded to the die. The method further comprises encapsulating at least a portion of the die and at least a portion of the at least one connector by an encapsulation material.

12 Claims, 6 Drawing Sheets

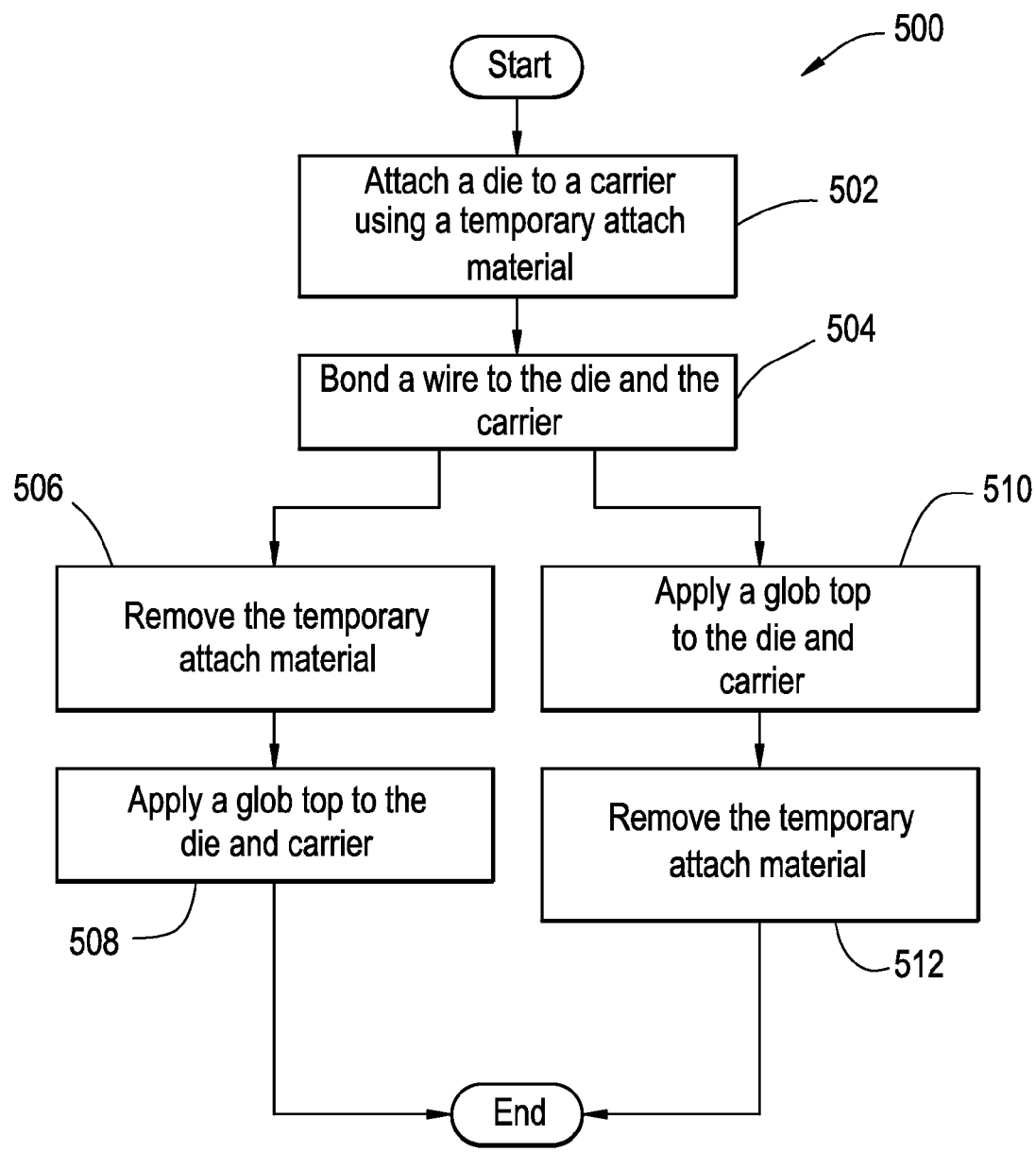

COMPONENT ASSEMBLY USING A TEMPORARY ATTACH MATERIAL

BACKGROUND OF THE INVENTION

The subject matter disclosed herein relates to a method of attaching a die to a carrier, and particularly to a method of attaching a die to a carrier using a temporary attach material.

Micro-electro-mechanical system (MEMS) devices are miniaturized mechanical elements, such as sensors, actuators, and electronics. MEMS are typically fabricated using integrated circuit (IC) processes. During fabrication of the MEMS device, a die of the MEMS device is attached to a carrier or support structure. In some applications, the die is attached to the carrier using an adhesive or epoxy.

Mounting the die to the carrier tends to introduce stress on the die. The stress can be created by different rates of thermal expansion between the die and the adhesive used to attach the die to the carrier. In addition to thermal expansion, stress may also be caused by differences in other material properties such as, for example, moisture adsorption or curing time. The stress introduced to the die may cause issues, especially if a MEMS pressure sensor that depends on detecting small amount of strain is attached to a die. This is because the stress introduced to the die may cause the die to generate inaccurate pressure readings.

One approach to reduce stress introduced to a die involves using a relatively soft die attach material. However, this approach is typically only effective for devices using a relatively large die and does not usually work when a smaller die, which has dimensions that are typically less than about 1 millimeter, is employed. The soft die attach material tends to allow for too much movement of the smaller die relative to the carrier. Movement of the smaller die relative to the carrier may hinder successful wire bonding of the die to the carrier, as the smaller die tends to wobble about the soft die attach material. Therefore, it would be desirable to provide a manufacturing process that allows for a die to be attached to the carrier without introducing a significant amount of stress to the die.

BRIEF DESCRIPTION OF THE INVENTION

According to one aspect of the invention, a method of attaching a die to a carrier using a temporary attach material is disclosed. The method comprises attaching the temporary attach material between a surface of the die and a surface of the carrier. The temporary attach material attaches the die to the carrier. The method comprises bonding at least one connector to the die and the carrier. The connector includes a first end bonded to the carrier and a second end bonded to the die. The method further comprises encapsulating at least a portion of the die and at least a portion of the at least one connector by an encapsulation material. The method further comprises removal of the temporary attach material such that the die is substantially detached from the carrier between the surface of the die and the surface of the carrier.

These and other advantages and features will become more apparent from the following description taken in conjunction with the drawings.

BRIEF DESCRIPTION OF THE DRAWING

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

FIG. 17 is a process flow diagram of the method illustrated in FIGS. 11-16.

The detailed description explains embodiments of the invention, together with advantages and features, by way of example with reference to the drawings.

DETAILED DESCRIPTION OF THE INVENTION

Figure 1:
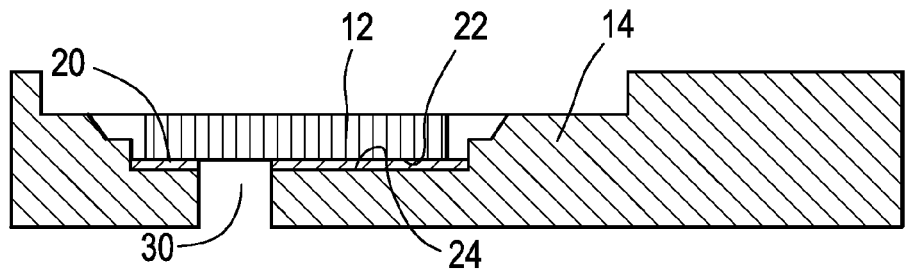
FIGS. 1-4 illustrate a method of attaching a die to a carrier.

FIGS. 1-4 illustrate an exemplary approach for attaching a die 12 to a carrier 14. The die 12 and carrier 14 may be employed in any number of applications such as, for example, a micro-electro-mechanical system (MEMS) device or an integrated circuit (IC). In one exemplary embodiment, the die 12 and carrier 14 are part of a MEMS pressure sensor used in medical applications such as, for example, a pressure monitor in a catheter. Referring now to FIG. 1, the die 12 is attached to the carrier 14 by a temporary attach material 20. The temporary attach material 20 is placed between a bottom surface 22 of the die 12 and a top surface 24 of the carrier 14 to attach the die 12 to the carrier 14. The temporary attach material 20 is in fluid communication with a vent hole 30 located in the carrier 14.

The temporary attach material 20 is generally any type of material that bonds the die 12 and the carrier 14 together and can be removed from the die 12 or carrier 14 by an appropriate approach as defined by the manufacturer of the temporary attach material 20. That is, the temporary attach material 20 is substantially removed when an appropriate cleaning or removal approach for the specific type of temporary attach material 20 is applied to the temporary attach material 20. The removal of the temporary attach material 20 causes the temporary attach material 20 to be released or removed, thereby causing the die 12 to substantially separate or detach from the top surface 24 of the carrier 14. Specifically, referring to FIG. 4, the position of the die 12 after removing the temporary attach material 20 is substantially determined by the thickness of the temporary attach material 20, and is discussed in greater detail below.

Turning back to FIG. 1, some examples of the temporary attach material 20 include, for example, bonding wax, solutions of bonding wax in solvent and adhesives that are typically used in temporary applications. Specifically, in one embodiment bonding wax and adhesives currently used as temporary adhesives for applications such as, for example, wafer mounting could also be used as the temporary attach material 20. Commercially available examples of the temporary attach material 20 are: adhesive having the trade name MB600 available from the Master Bond Corporation located in Hackensack, N.J., and Crystalbond 590 available from Ted Pella Incorporated located in Redding, Calif.

Figure 2:
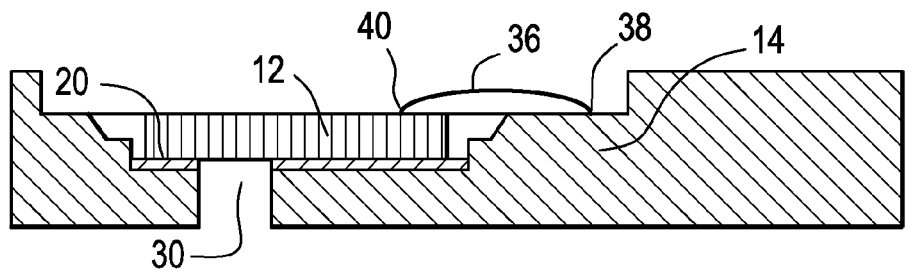

FIG. 2 is an illustration of a connector 36. In one embodiment, an electrical conductor such as, for example, a wire 36 is the connector, and is bonded to both of the die 12 and the carrier 14 during a wire bonding operation. The wire 36 includes a first end 38 that is bonded to the carrier 14 and a second end 40 that is bonded to the die 12. Although FIGS.

2-4 illustrate only one wire 36 connecting the die 12 to the carrier 14, it is understood that multiple wires may be used as well to connect the die 12 to the carrier 14. In one embodiment the wire 36 is attached to a wire bond pad (not shown) located on the die 12 and a finger (not shown) located on the carrier 14. The wire 36 is bonded to the die 12 and the carrier 14 by heating the die 12 and the carrier 14 to an elevated temperature, and then pressing the wire 36 to both the die 12 and the carrier 14. The temporary attach material 20 that is selected can generally withstand the elevated temperatures the die 12 and carrier 14 experience during the wire bonding process. In one example, the wire bonding process requires that the die 12 and the carrier 14 being heated between the ranges of about 100° C. to about 150° C.

Figure 3:
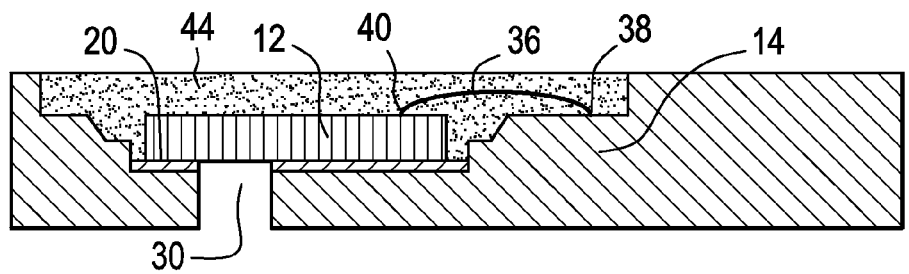

FIG. 3 is an illustration of the die 12, the carrier 14, and the wire 36 being encapsulated by an encapsulation material 44 that is bonded to at least the carrier 14 and the die 12. In one embodiment, the encapsulation material 44 is an epoxy based resin or a silicone based elastomer. Encapsulation aids in protecting the die 12 and the carrier 14, as well as the wire bonds between the die 12 and the carrier 14.

Figure 4:
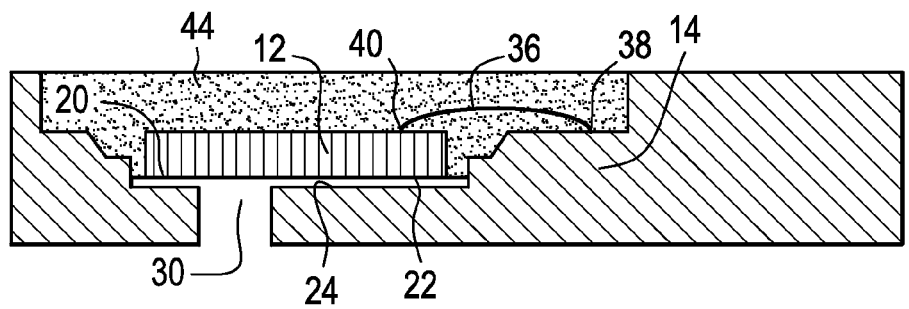

FIG. 4 is an illustration of the die 12 and the carrier 14, where the temporary attach material 20 has been substantially removed by a removal media. Specifically, temporary attach material 20 has been removed such that the die 12 is substantially detached from the carrier 14 at the bottom surface 22 of the die 12 and the top surface 24 of the carrier 14. The removal media is introduced to the temporary attach material 20 (shown in FIGS. 1-3) through the vent hole 30. The vent hole 30 receives the removal media from a source (not shown). The die 12 remains held in position by the wire 36 and the encapsulant 44 at a position substantially determined by the thickness of the temporary attach material 20 shown in FIGS. 1-3. Specifically, as shown in FIG. 4 the die 12 is suspended over a portion of the carrier 14 by the encapsulant 44.

The removal approach is selected based on the type of temporary attach material 20. That is, the removal approach is specifically configured, as recommended by the manufacturer of the temporary attach material 20, for substantially removing the temporary attach material 20. In one example, the temporary attach material 20 may be removed by heating to melt away the temporary attach material 20, and then removing any residue in alcohol.

The removal approach substantially removes the temporary attach material 20, where the die 12 is no longer attached to the carrier 14 along the bottom surface 22 of the die 12. Instead, referring specifically to FIG. 4, the die 12 is secured in place by the wire 36 and the encapsulation material 44. Removing the temporary attach material 20 reduces or eliminates the possibility of introducing stress created by different material properties between the die 12 and the die attach material during fabrication.

Figure 5:
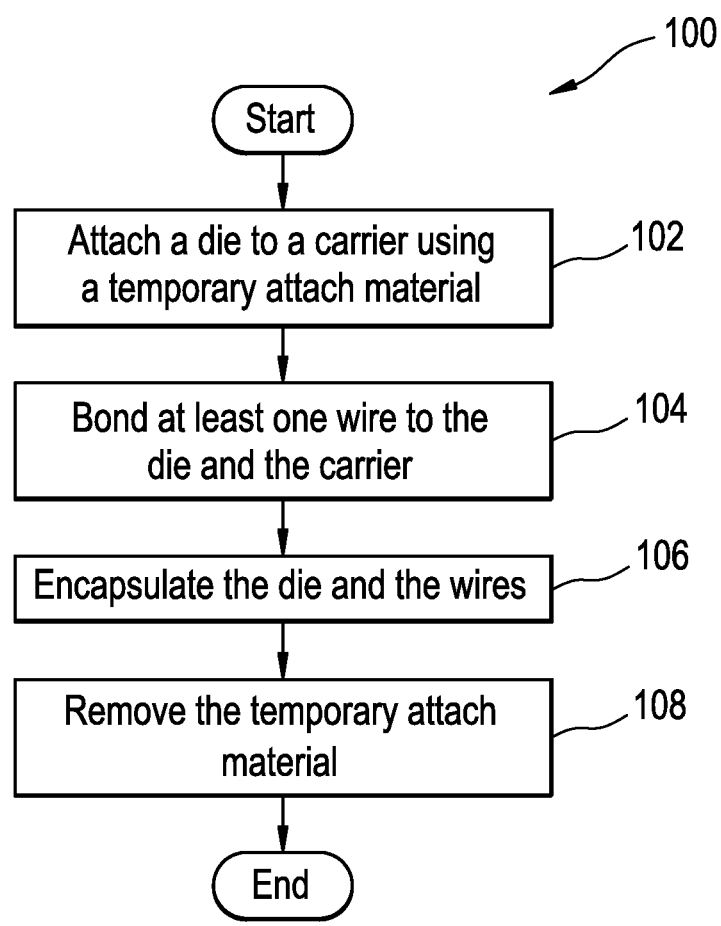
FIG. 5 is a process flow diagram of the method illustrated in FIGS. 1-4.

A method of attaching a die 12 to a carrier 14 using a temporary attach material 20 will now be discussed. FIG. 5 is a process flow diagram illustrating a method 100 of attaching the die 12 to the carrier 14. The method 100 begins at 102, where the temporary attach material 20 is placed between a bottom surface 22 of the die 12 and a top surface 24 of the carrier 14, where the temporary attach material 20 attaches the die 12 to the carrier 14. The temporary attach material 20 is generally any type of material that bonds the die 12 and the carrier 14 together and can be substantially removed by an appropriate removal approach. Method 100 may then proceed to 104.

In 104, at least one wire 36 is bonded to the die 12 and the carrier 14. Specifically, referring to FIG. 2, the wire 36 includes a first end 38 bonded to the carrier 14 and a second end 40 bonded to the die 12. Method 100 may then proceed to 106.

In 106, the die 12 and the wires 14 are encapsulated by an encapsulation material 44. Referring to FIG. 3, in one embodiment the encapsulation material 44 is an epoxy based resin or a silicone based elastomer. Method 100 may then proceed to 108.

In 108, a removal approach is employed to substantially remove the temporary attach material 20. In the embodiment as shown in FIG. 4, the removal media is introduced by a vent hole 30 located within the carrier 14. The removal media is formulated to substantially remove the temporary attach material 20 such that the die 12 is substantially detached from the carrier 14 between the bottom surface 22 of the die 12 and the top surface 24 of the carrier 14. Method 100 may then terminate.

Figure 6:
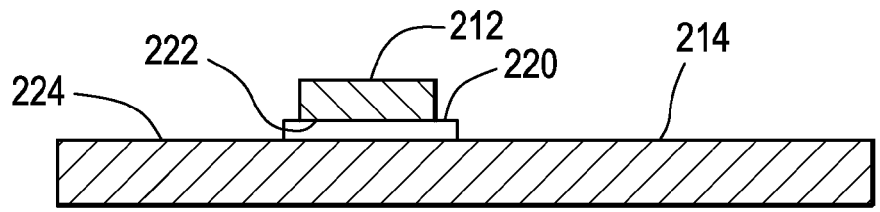
FIGS. 6-9 illustrate an alternative embodiment of a method of attaching a die to a carrier.

FIGS. 6-9 illustrate an alternative method of attaching a die 212 to a carrier 214. Referring now to FIG. 6, the die 212 is attached to the carrier 214 by a temporary attach material 220. The temporary attach material 220 is placed between a bottom surface 222 of the die 212 and a top surface 224 of the carrier 214 to attach the die 212 to the carrier 214.

Figure 7:
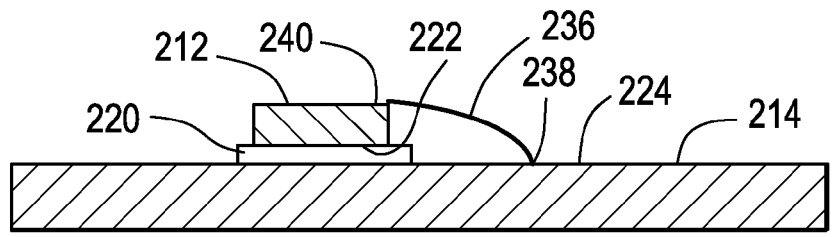

FIG. 7 is an illustration of a first wire 236 being bonded to both of the die 212 and the carrier 214 during a first wire bonding operation. The wire 236 includes a first end 238 that is bonded to the carrier 214 and a second end 240 that is bonded to the die 212.

Figure 8:
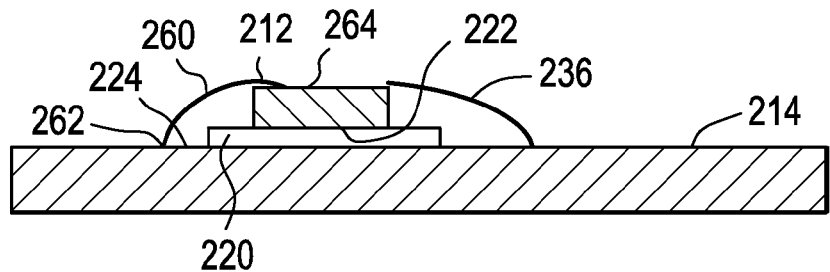

FIG. 8 is an illustration of another or second wire 260 being bonded to both of the die 212 and the carrier 214 during a second wire bonding operation. The wire 260 includes a first end 262 that is bonded to the carrier 214 and a second end 264 that is bonded to the die 212. The second wire 260 is positioned to generally oppose the first wire 236, and is employed to substantially prevent the die 212 from inadvertently flipping over or shifting in relation to the carrier 214 during handling of the carrier 214 after the temporary attach material 220 has been substantially removed. The die 212 is typically sized such that the second wire 260 provides the support needed to secure the die 212 in place relative to the carrier 214. Typically, the die 212 generally includes dimensions that are less than about 1 millimeter.

Figure 9:
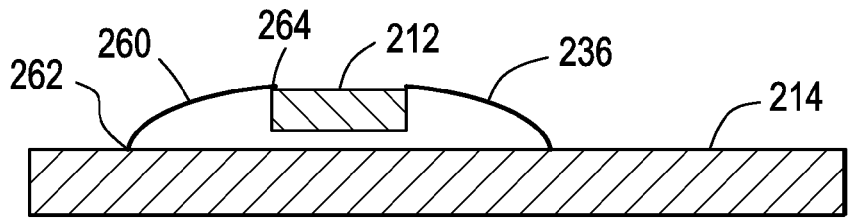

FIG. 9 is an illustration of the die 212 and the carrier 214, where the temporary attach material 220 has been substantially removed. In one exemplary embodiment, the removal media is introduced to the temporary attach material 220 by substantially placing the assembly in the removal media, however it is understood that other approaches may be used as well for removing the temporary attach material 220. The removal media causes the temporary attach material 220 to be removed from the assembly, causing the die 212 to substantially separate or detach from the top surface 224 of the carrier 214.

Figure 10:
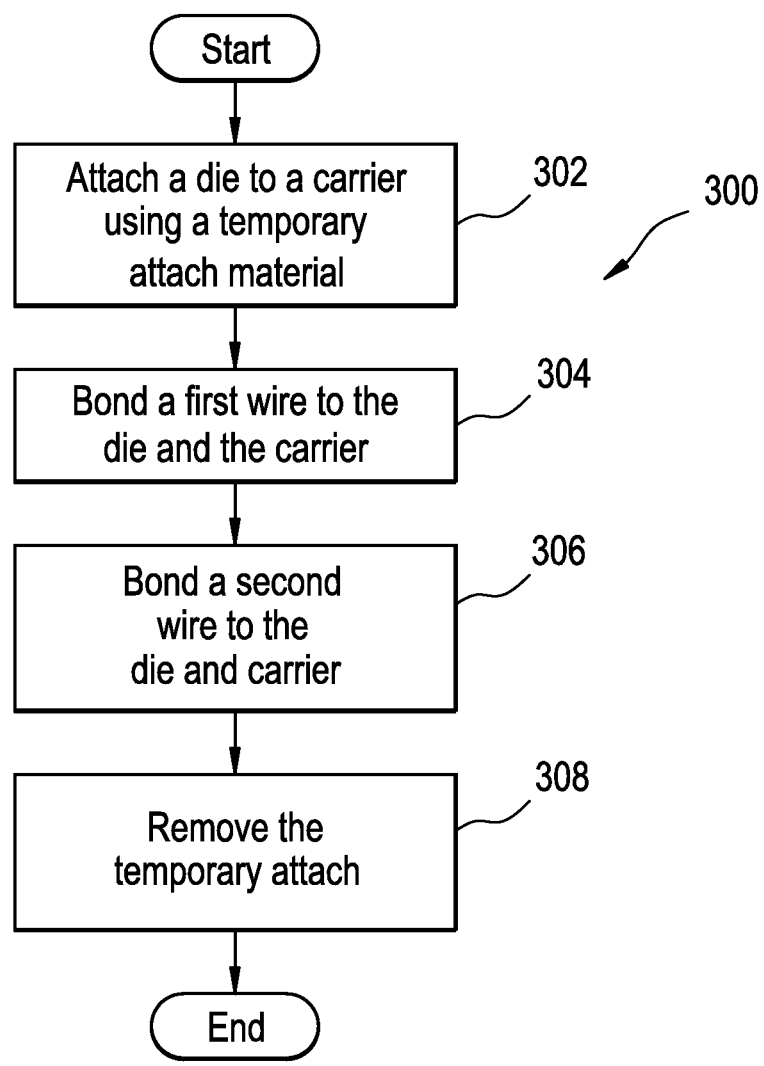
FIG. 10 is a process flow diagram of the method illustrated in FIGS. 6-9.

A method of attaching a die 212 to a carrier 214 using a temporary attach material 220 will now be discussed. FIG. 10 is a process flow diagram illustrating a method 300 of attaching the die 212 to the carrier 214. The method 300 begins at 302, where the temporary attach material 220 is placed between a bottom surface 222 of the die 212 and a top surface 224 of the carrier 214, where the temporary attach material 220 attaches the die 212 to the carrier 214. Method 300 may then proceed to 304.

In 304, a first wire 236 is bonded to the die 212 and the carrier 214. Specifically, referring to FIG. 7, the wire 236 includes a first end 238 bonded to the carrier 214 and a second end 240 bonded to the die 212. Method 300 may then proceed to 306.

In 306, a second wire 260 is bonded to both of the die 212 and the carrier 214 during a second wire bonding operation. Referring to FIG. 9, the wire 260 includes a first end 262 that is bonded to the carrier 214 and a second end 264 that is bonded to the die 212. The second wire 260 is positioned to generally oppose the first wire 136, and is employed to substantially prevent the die 212 from inadvertently flipping over or shifting in relation to the carrier 214. Method 300 may then proceed to 308.

In 308, the temporary attach material 220 is substantially removed by a specified approach. In one exemplary embodiment, the temporary attach material 220 is substantially removed by placing the temporary attach material 220 in a removal media. The removal media substantially removes the temporary attach material 220. Method 300 may then terminate.

In yet another embodiment as shown in FIGS. 11-16, an alternative approach of attaching a die 412 to a carrier 414 is disclosed, where a glob top 470 (shown in FIGS. 14-16) is placed over the die 412. The glob top 470 is employed for providing protection to a wire 436, and also secures the die 412 in place during handling. The glob top 470 is a material that is soft enough not to generate any significant amount of stress that could be exerted on the die 412, and may be the same type of material as the encapsulant 44 illustrated in FIGS. 3-4. For example, in one embodiment the glob top 470 is an epoxy based resin or a silicone based elastomer.

Figure 11:
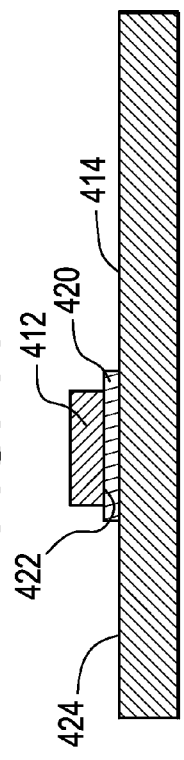
FIGS. 11-16 illustrate yet another embodiment of a method of attaching a die to a carrier.

Referring now to FIG. 11, the die 412 is attached to the carrier 414 by a temporary attach material 420. The temporary attach material 420 is placed between a bottom surface 422 of the die 412 and a top surface 424 of the carrier 414 to attach the die 412 to the carrier 414.

Figure 12:
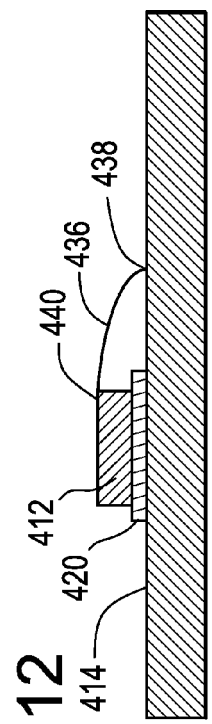

FIG. 12 is an illustration of a wire 436 being bonded to both of the die 412 and the carrier 414 during a wire bonding operation. The wire 436 includes a first end 438 that is bonded to the carrier 414 and a second end 440 that is bonded to the die 412. It is understood that while FIG. 12 illustrates a single wire 436, multiple wires may be used as well. For example, referring to FIGS. 6-9, and in particular to FIG. 8, in an alternative embodiment a second wire such as the second wire 260 may be bonded to both of the die 212 and the carrier 214 during a second wire bonding operation. A second wire is employed to substantially prevent the die from inadvertently flipping over or shifting in relation to the carrier 214 during handling.

Figure 13:
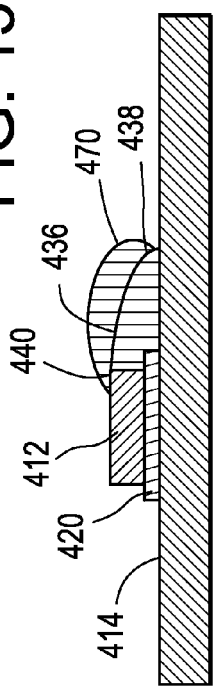
Figure 14:
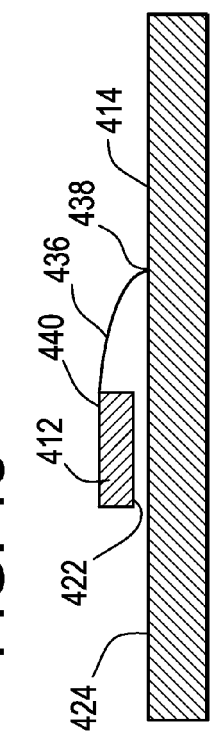
Figure 15:
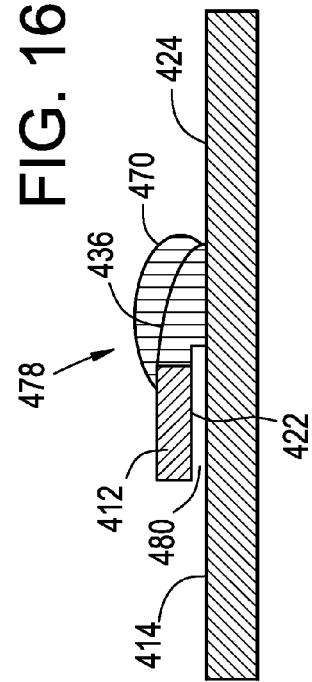
Figure 16:
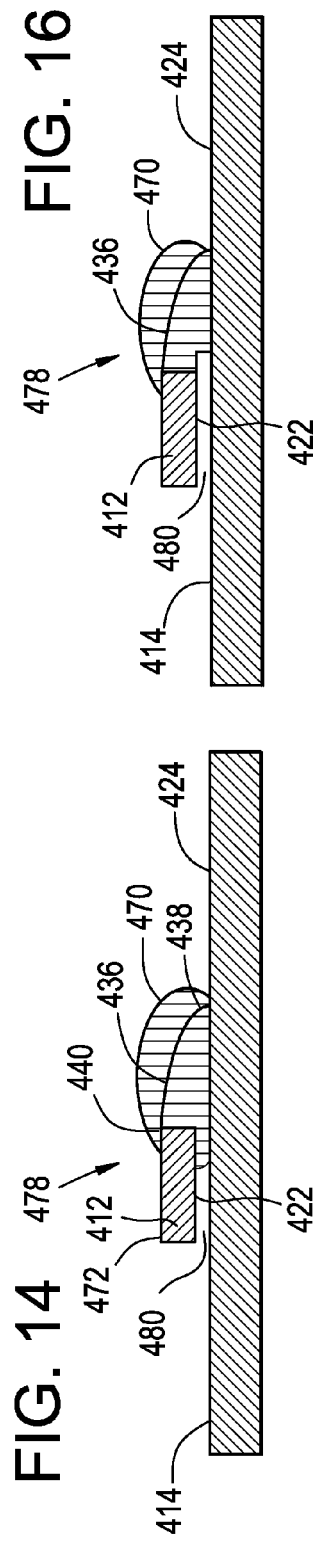

Turning back to FIG. 12, after the wire 436 has been bonded, two approaches are available for substantially removing the temporary attach material 420. Specifically, a first approach is shown in FIGS. 13-14 and an alternative approach is shown in FIGS. 15-16. Referring now to FIG. 13, the temporary attach material 420 has been substantially removed. In one embodiment, the temporary attach material 420 is substantially placing the temporary attach material 420 in a removal media specified for the temporary attach material 420. When the temporary attach material 420 is removed, the die 412 is substantially detached from the carrier 414 at the bottom surface 422 of the die 412.

FIG. 14 is an illustration of the glob top 470 being applied to a top surface 472 of the die, the wire 436, and the carrier 414. Specifically, the glob top 470 protects the bonds between the first end 438 of the wire 436 and the carrier 414 and the second end 440 of the wire 436 and the die 412. In one embodiment, if the die 412 is employed in a device such as a MEMS pressure sensor, the glob top 470 is confined to an end 478 of the die 412 that does not include a sensing element (not shown). In the embodiment as shown in FIG. 14, a portion of the glob top 470 penetrates a gap 480 located between the bottom surface 422 of the die 412 and the top surface 424 of the carrier 414. The glob top 470 is employed to secure the die 412 in place securely in relation to the carrier 414 during handling of the carrier 414.

In an alternative approach as illustrated in FIGS. 15-16, the glob top 470 is first applied to the top surface 472 of the die, the wire 436, and the carrier 414. Referring to FIG. 15, the glob top 470 protects the bonds between the first end 438 of the wire 436 and the carrier 414 and the second end 440 of the wire 436 and the die 412. Referring now to FIG. 16, a removal approach is employed for substantially removing the temporary attach material 420. When the temporary attach material 420 is removed, the die 412 is substantially detached from the carrier 414 at the bottom surface 422 of the die 412 and the top surface 424 of the carrier 414. In the embodiment as shown in FIG. 16, the glob top 470 does not generally penetrate the gap 480 located between the bottom surface 422 of the die 412 and the top surface 424 of the carrier 414.

A method of attaching a die 412 to a carrier 414 using a temporary attach material 420 will now be discussed. FIG. 17 is a process flow diagram illustrating a method 500 of attaching the die 412 to the carrier 414. The method 500 begins at 502, where the temporary attach material 420 is placed between a bottom surface 422 of the die 412 and a top surface 424 of the carrier 414, where the temporary attach material 420 attaches the die 412 to the carrier 214. Method 500 may then proceed to 504.

In 504, a first wire 436 is bonded to the die 412 and the carrier 414. Specifically, referring to FIG. 12, the wire 436 includes a first end 438 bonded to the carrier 414 and a second end 440 bonded to the die 412. In a first embodiment, method 500 may then proceed to 506, where the temporary attach material 420 is removed. Alternatively, in another embodiment, method 500 may then proceed to 510, where a glob top 470 is applied to the die 412.

In 506, a removal media is introduced to the temporary attach material 420. The specific type of removal media employed depends on the type of temporary attach material 420. The removal media substantially removes the temporary attach material 420. Method 500 may then proceed to 508.

In 508, the glob top 470 is applied to a top surface 472 of the die, the wire 436, and the carrier 414. In the embodiment as shown in FIG. 14, a portion of the glob top 470 penetrates a gap 480 located between the bottom surface 422 of the die 412 and the top surface 424 of the carrier 414. Method 500 may then terminate.

In an alternative embodiment, 504 then proceeds to 510, where the glob top 470 is applied to a top surface 472 of the die, the wire 436, and the carrier 414. Method 500 may then proceed to 512.

In 512, a removal media is introduced to the temporary attach material 420. The removal media substantially removes the temporary attach material 420. In the embodiment as shown in FIG. 16, the glob top 470 does not generally penetrate the gap 480 located between the bottom surface 422 of the die 412 and the top surface 424 of the carrier 414. This is because the temporary attach material 420 was present when the glob top 470 was applied, thus preventing the ingression of the glob top 470 into the gap 480. Method 500 may then terminate.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A method of attaching a die to a carrier using a temporary attach material, the method comprising:
   placing the temporary attach material between a surface of the die and a surface of the carrier, wherein the temporary attach material attaches the die to the carrier;
   bonding at least one connector to the die and the carrier, wherein the at least one connector includes a first end bonded to the carrier and a second end bonded to the die;
   encapsulating at least a portion of the die and at least a portion of the at least one connector by an encapsulation material;
   substantially removing the temporary attach material such that the die is substantially detached from the carrier between at least one surface of the die and one surface of the carrier; and
   removing the temporary attach material before encapsulating at least a portion of the die and at least a portion of the at least one connector by the encapsulation material.

2. The method of claim 1, comprising removing the temporary attach material through a vent hole within the carrier.

3. The method of claim 1, comprising bonding an other connector to the die and the carrier, wherein the other connector includes an other first end bonded to the carrier and an other second end bonded to the die, wherein the other connector generally opposes the at least one connector.

4. The method of claim 1, wherein the die is suspended over a portion of the carrier by the encapsulation material.

5. The method of claim 1, wherein the temporary attach material is one or more of a water soluble adhesive, a solution of bonding wax in solvent, bonding wax, and a temporary adhesive.

6. The method of claim 1, wherein the connector is an electrical conductor.

7. A method of attaching a die to a carrier using a temporary attach material, the method comprising:
   placing the temporary attach material between a surface of the die and a surface of the carrier, wherein the temporary attach material attaches the die to the carrier;
   bonding a first connector to the die and the carrier, wherein the first connector includes a first connector first end bonded to the carrier and a first connector second end bonded to the die;
   bonding a second connector to the die and the carrier, wherein the second connector includes a second connector first end bonded to the carrier and a second connector second end bonded to the die;
   applying a glob top to the die to at least partially cover the first connector first end and the second connector first end, and the first connector second end and the second connector second end;
   substantially removing the temporary attach material such that the die is substantially detached from the carrier between at least one die surface and one carrier surface; and
   applying the glob top to the die after removal of the temporary attach material.

8. The method of claim 7, wherein the second connector generally opposes the first connector.

9. The method of claim 7, wherein the temporary attach material is one or more of a water soluble adhesive, a solution of bonding wax in solvent, bonding wax, and a temporary adhesive.

10. The method of claim 7, wherein the first connector comprises an electrical conductor.

11. The method of claim 7, wherein the die is suspended over a portion of the carrier by the glob top.

12. The method of claim 10, wherein the second connector comprises an electrical conductor.

* * * * *